(12) United States Patent
Imanishi

(10) Patent No.: US 10,629,619 B2
(45) Date of Patent: Apr. 21, 2020

(54) SEMICONDUCTOR INTEGRATED CIRCUIT

(71) Applicant: Mitsubishi Electric Corporation, Tokyo (JP)

(72) Inventor: Motoki Imanishi, Fukuoka (JP)

(73) Assignee: Mitsubishi Electric Corproation, Tokyo (JP)

( * ) Notice: Subject to any disclaimer, the term of this patent is extended or adjusted under 35 U.S.C. 154(b) by 0 days.

(21) Appl. No.: 16/044,745

(22) Filed: Jul. 25, 2018

(65) Prior Publication Data

US 2019/0096910 A1 Mar. 28, 2019

(30) Foreign Application Priority Data

Sep. 25, 2017 (JP) .................. 2017-183122

(51) Int. Cl.
| | | |
|---|---|---|
| H03K 17/60 | (2006.01) | |
| H01L 27/12 | (2006.01) | |
| H03K 17/567 | (2006.01) | |
| H03K 17/691 | (2006.01) | |
| G01R 31/28 | (2006.01) | |
| H03K 17/689 | (2006.01) | |
| H04L 25/02 | (2006.01) | |
| G01R 31/02 | (2006.01) | |

(52) U.S. Cl.
CPC ...... *H01L 27/1203* (2013.01); *G01R 31/2879* (2013.01); *H03K 17/567* (2013.01); *H03K 17/689* (2013.01); *H03K 17/691* (2013.01); *H04L 25/0266* (2013.01); *G01R 31/025* (2013.01)

(58) Field of Classification Search
None
See application file for complete search history.

(56) References Cited

U.S. PATENT DOCUMENTS

| | | | | |
|---|---|---|---|---|
| 8,358,129 B2 * | 1/2013 | Innai | ...................... | B82Y 25/00 |
| | | | | 324/244 |
| 8,782,503 B2 * | 7/2014 | Kaeriyama | ........... | H01L 25/162 |
| | | | | 714/799 |

(Continued)

FOREIGN PATENT DOCUMENTS

| | | |
|---|---|---|
| JP | 2013-051547 A | 3/2013 |
| JP | 2016-015393 A | 1/2016 |

*Primary Examiner* — Lincoln D Donovan
*Assistant Examiner* — Khareem E Almo
(74) *Attorney, Agent, or Firm* — Studebaker & Brackett PC

(57) ABSTRACT

Provided is a semiconductor integrated circuit that improves insulation reliability between a high-voltage circuit and a low-voltage circuit. The semiconductor integrated circuit includes the following: a first circuit controlled by a control signal of low voltage and driven at a higher voltage; a second circuit configured to output the control signal to the first circuit to control the driving of the first circuit; and an insulation circuit including insulating elements connected to each other in series, the insulation circuit connecting between the first and the second circuits in series. The insulation circuit is configured to magnetically or capacitively couple the control signal in each insulating element to transmit the control signal from the second circuit to the first circuit, and is configured to insulate the first circuit from the second circuit in each insulating element to prevent the higher voltage from being applied between the first and second circuits.

7 Claims, 6 Drawing Sheets

(56) References Cited

U.S. PATENT DOCUMENTS

| | | | |
|---|---|---|---|
| 9,395,402 B2* | 7/2016 | Nagase | G01R 31/1263 |
| 2004/0085117 A1* | 5/2004 | Melbert | H03K 17/166 |
| | | | 327/432 |
| 2009/0052214 A1* | 2/2009 | Edo | H01F 27/2804 |
| | | | 363/123 |
| 2013/0055052 A1 | 2/2013 | Kaeriyama | |
| 2013/0234779 A1* | 9/2013 | Klug, Jr. | H03K 17/04123 |
| | | | 327/432 |
| 2014/0035656 A1* | 2/2014 | Takao | H03K 17/6871 |
| | | | 327/432 |
| 2015/0249448 A1* | 9/2015 | Hirler | H03K 17/567 |
| | | | 327/432 |
| 2015/0280706 A1* | 10/2015 | Sicard | H03K 17/0828 |
| | | | 327/432 |
| 2016/0003887 A1 | 1/2016 | Nagase | |

* cited by examiner

F I G . 1
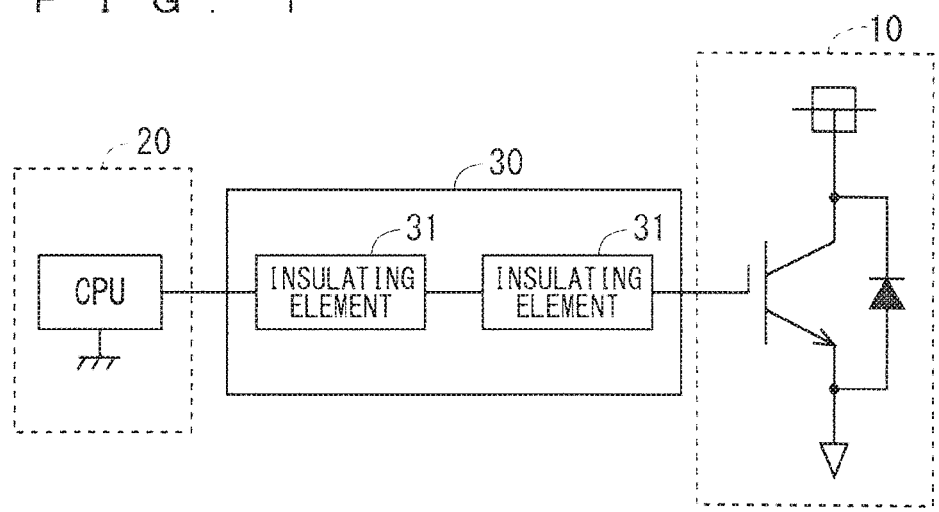

F I G. 3
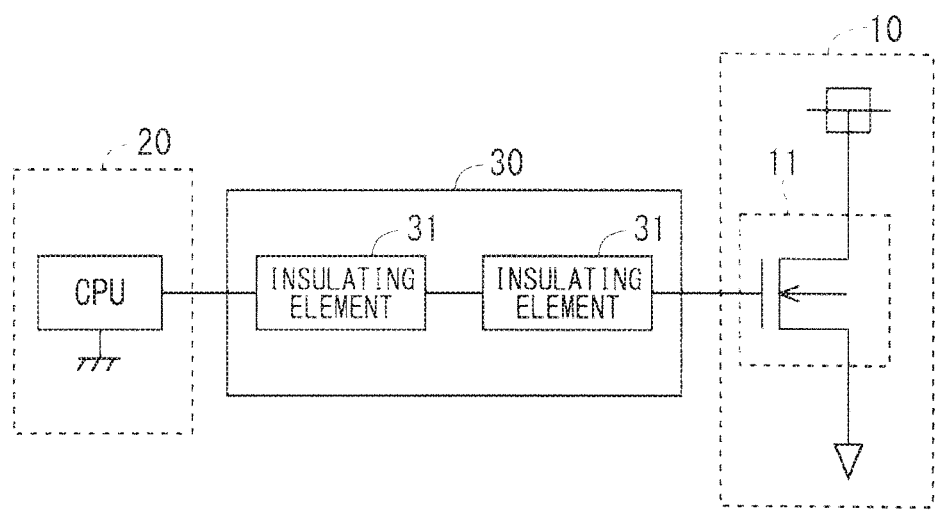

SEMICONDUCTOR INTEGRATED CIRCUIT

BACKGROUND OF THE INVENTION

Field of the Invention

The present invention relates to semiconductor integrated circuits.

Description of the Background Art

Insulation circuits (isolators) each have been conventionally interposed between a central processing unit (CPU) forming a control circuit positioned at a higher level of a system, and a semiconductor switching element driven at a high voltage in the system. For instance, Japanese Patent Application Laid-Open No. 2013-51547 discloses a semiconductor integrated circuit including an insulation circuit, such as a photocoupler or a digital isolator. The semiconductor integrated circuit transmits a signal while insulating a transmission circuit from a reception circuit.

The photocoupler or the digital isolator has an insulating portion composed of an organic compound. Applying a voltage equal to or greater than a dielectric strength across the insulating portion within the isolator produces an electrical breakdown to pass a short-circuit current through the insulating portion. The CPU, disposed at a higher level of the system, and the inside of the system to which a high voltage is applied are unfortunately no longer insulated from each other.

SUMMARY

It is an object of the Specification to provide a semiconductor integrated circuit that improves insulation reliability between a circuit driven at a high voltage and a circuit driven at a lower voltage than the high voltage.

An aspect of the Specification provides a semiconductor integrated circuit that includes the following: a first circuit controlled by a control signal of low voltage and driven at a higher voltage than the control signal of low voltage; a second circuit configured to output the control signal of low voltage to the first circuit to control the driving of the first circuit; and an insulation circuit including a plurality of insulating elements connected to each other in series, the insulation circuit connecting between the first circuit and the second circuit in series. The insulation circuit is configured to magnetically couple or capacitively couple the control signal in each insulating element to transmit the control signal from the second circuit to the first circuit, and is configured to insulate the first circuit from the second circuit in each insulating element to prevent the higher voltage from being applied from the first circuit to the second circuit.

The semiconductor integrated circuit according to the aspect of the Specification improves insulation reliability between a circuit driven at a high voltage and a circuit driven at a lower voltage than the high voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram of a configuration of a semiconductor integrated circuit according to a first preferred embodiment;

FIG. 3 is a diagram of a configuration of a semiconductor integrated circuit according to a third preferred embodiment;

DESCRIPTION OF THE PREFERRED EMBODIMENTS

First Preferred Embodiment

Figure 2:
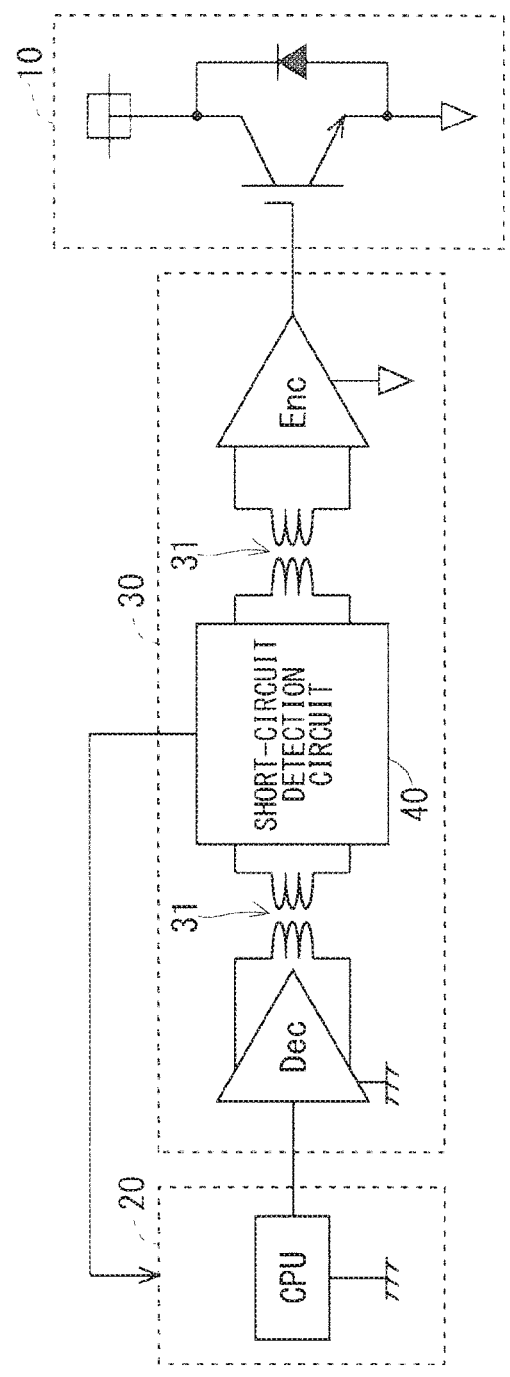
FIG. 2 is a diagram of a configuration of a semiconductor integrated circuit according to a second preferred embodiment.

The following describes a semiconductor integrated circuit according to a first preferred embodiment. FIG. 1 is a diagram of a configuration of the semiconductor integrated circuit according to the first preferred embodiment.

The semiconductor integrated circuit includes a first circuit 10, a second circuit 20, and an insulation circuit 30.

The first circuit 10 includes a switching element, and is disposed at a lower level of a system (not shown). The first circuit 10 receives a control signal of low voltage from the second circuit 20, and is driven at a higher voltage than the control signal of low voltage. The switching element outputs the high voltage in response to the reception of the control signal of low voltage for instance. In the first preferred embodiment, the switching element is a semiconductor device called a power semiconductor device to which the high voltage is applied.

The second circuit 20 is disposed at a higher level of the system, and is a CPU for instance. The second circuit 20 outputs the control signal of low voltage to the first circuit 10 to control the driving of the first circuit 10.

The insulation circuit 30 connects between the first circuit 10 and the second circuit 20 in series.

The insulation circuit 30 includes a plurality of insulating elements 31 connected to each other in series. In the first preferred embodiment, two insulating elements 31 are connected in series. The insulation circuit 30 may include two or more insulating elements connected in series.

The insulation circuit 30 magnetically couples or capacitively couples the control signal in each insulating element 31 to transmit the control signal from the second circuit 20 to the first circuit 10. Further, the insulation circuit 30 insulates the first circuit 10 from the second circuit 20 in each insulating element 31 to prevent the higher voltage from being applied from the first circuit 10 to the second circuit 20.

Even if an electrical breakdown is produced in any of the insulation elements, the semiconductor integrated circuit enables the remaining insulating elements to securely insulate the first circuit 10 from the second circuit 20. Moreover, the semiconductor integrated circuit enables the system to which the high voltage is applied and components including the CPU driven at the lower voltage than the high voltage to be securely insulated from each other. That is, the semiconductor integrated circuit in the first preferred embodiment improves insulation reliability between the second circuit 20, driven at the high voltage, and the first circuit 10, driven at the lower voltage than the high voltage.

Second Preferred Embodiment

The following describes a semiconductor integrated circuit according to a second preferred embodiment. It is noted that similar components and similar operations between the first preferred embodiment and the second preferred embodiment will not be elaborated upon here.

FIG. 2 is a diagram of a configuration of the semiconductor integrated circuit according to the second preferred embodiment.

An insulation circuit 30 includes a short-circuit detection circuit 40 connected between two insulating elements 31 adjacent to each other. The insulating elements 31 have the same dielectric strength. In the second preferred embodiment, the insulation circuit 30 is a digital isolator; moreover, each insulating element 31 is a magnetic coupling element and is a transformer for instance. It is noted that each insulating element 31 may be a capacitive coupling element, such as a capacitor.

The insulation circuit 30 magnetically couples the control signal in each insulating element 31 to transmit the control signal from the second circuit 20 to the first circuit 10. When the insulating element 31 is a capacitive coupling element, the insulation circuit 30 capacitively couples the control signal to transmit the control signal from the second circuit 20 to the first circuit 10.

The insulation circuit 30 insulates the first circuit 10 from the second circuit 20 in each insulating element 31 to prevent the higher voltage from being applied from the first circuit 10 to the second circuit 20.

The short-circuit detection circuit 40 detects an electrical breakdown, if any, in accordance with the potential difference between the two adjacent insulating elements 31, and then outputs information about the electrical breakdown. The information about the electrical breakdown is transmitted to the CPU and treated as information for protecting a circuit connected to the CPU, for instance.

It is noted that the insulation circuit 30 may include three or more insulating elements 31, and that the short-circuit detection circuits 40 may be connected between the individual insulating elements 31. The CPU, which is the second circuit 20, accordingly identifies which short-circuit detection circuit 40 outputs the information about the electrical breakdown to determine a breakdown site.

Third Preferred Embodiment

The following describes a semiconductor integrated circuit according to a third preferred embodiment. It is noted that similar components and similar operations between the first or second preferred embodiment and the third preferred embodiment will not be elaborated upon here.

FIG. 3 is a diagram of a configuration of the semiconductor integrated circuit according to the third preferred embodiment.

A first circuit 10 includes a switching element 11. The switching element 11 is a semiconductor device formed of a transistor containing SiC and called a power semiconductor device to which a high voltage is applied. Herein, the switching element 11 is a SiC metal-oxide-semiconductor field-effect transistor (MOSFET).

A second circuit 20 outputs the control signal to the switching element 11 to control the driving of the switching element 11 to control the driving of the first circuit 10.

A power semiconductor device, such as a SiC MOSFET provides high performance in an application requiring high-speed operation or an application requiring high strength. In the third preferred embodiment, the semiconductor integrated circuit includes the insulation circuit 30, such as digital isolators having high-insulation performance and high-speed performance. This improves a system level when the semiconductor integrated circuit controls the driving of the power semiconductor device.

Fourth Preferred Embodiment

The following describes a semiconductor integrated circuit according to a fourth preferred embodiment. It is noted that similar components and similar operations between any of the first to third preferred embodiments and the fourth preferred embodiment will not be elaborated upon here.

Figure 4:
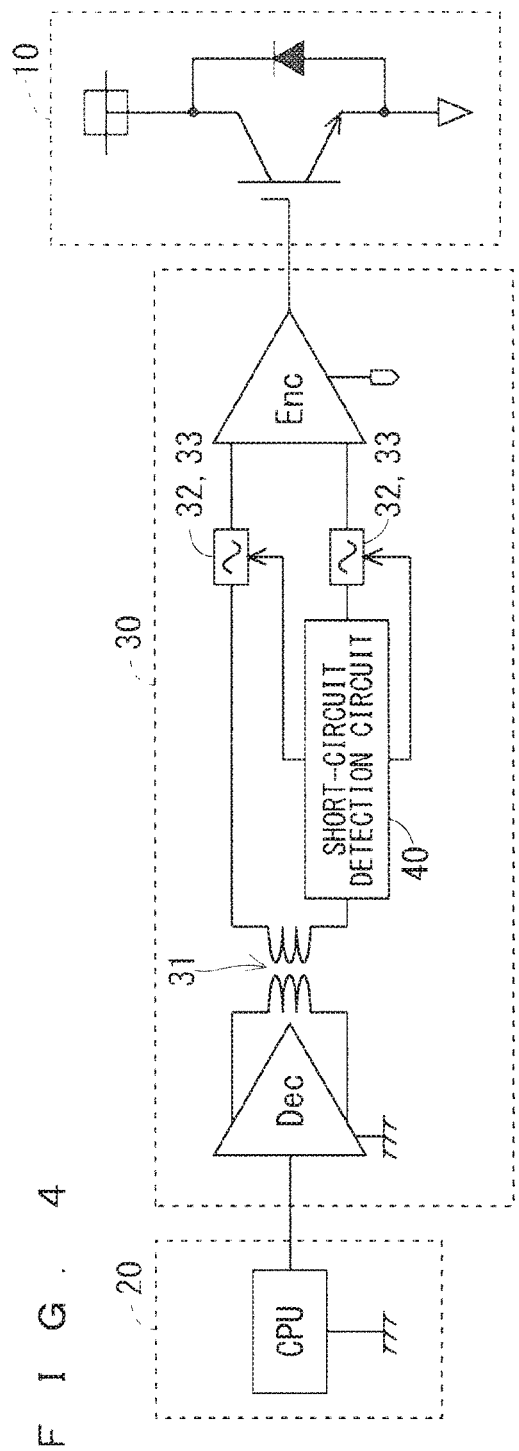
FIG. 4 is a diagram of a configuration of a semiconductor integrated circuit according to a fourth preferred embodiment.

FIG. 4 is a diagram of a configuration of the semiconductor integrated circuit according to the fourth preferred embodiment.

An insulation circuit 30 includes at least one insulating element 31 and at least one breaking element 32 connected to each other in series. The breaking element 32 is switchable from a conduction state into an insulation state. Further, the insulation circuit 30 connects between the first circuit 10 and the second circuit 20 in series. The insulation circuit 30 in the fourth preferred embodiment is a digital isolator, and includes a single magnetic coupling element as the insulating element 31 and two electric fuse elements 33 as the breaking elements 32. Further, the insulation circuit 30 includes a short-circuit detection circuit 40 between the first circuit 10 and the second circuit 20. Herein, the short-circuit detection circuit 40 is disposed within the digital isolator. The short-circuit detection circuit 40 and the electric fuse elements 33 are connected on the side near the first circuit 10 with respect to the insulating element 31 in the insulation circuit 30.

In a normal state, the electric fuse elements 33 are each in electrical conduction; moreover, the insulation circuit 30 magnetically couples a control signal in the insulating element 31 to transmit the control signal from the second circuit 20 to the first circuit 10. When the insulating element 31 is a capacitive coupling element, the insulation circuit 30 capacitively couples the control signal to transmit the control signal from the second circuit 20 to the first circuit 10.

The insulation circuit 30 insulates the first circuit 10 from the second circuit 20 in the insulating element 31 to prevent a higher voltage from being applied from the first circuit 10 to the second circuit 20.

In an electrical breakdown, a short-circuit current flows from the first circuit 10, having a higher potential, to the second circuit 20, having a lower potential. The short-circuit detection circuit 40 detects this short-circuit current. The electric fuse element 33 fuses in accordance with this detection, thereby breaking the electrical conduction between the first circuit 10 and the second circuit 20.

As described above, if the insulating element 31 has an electrical breakdown, the breaking elements 32 would maintain insulation, thereby preventing further damage to the second circuit 20 due to the short-circuit current.

Fifth Preferred Embodiment

The following describes a semiconductor integrated circuit according to a fifth preferred embodiment. It is noted that similar components and similar operations between any of the first to fourth preferred embodiments and the fifth preferred embodiment will not be elaborated upon here.

Figure 5:
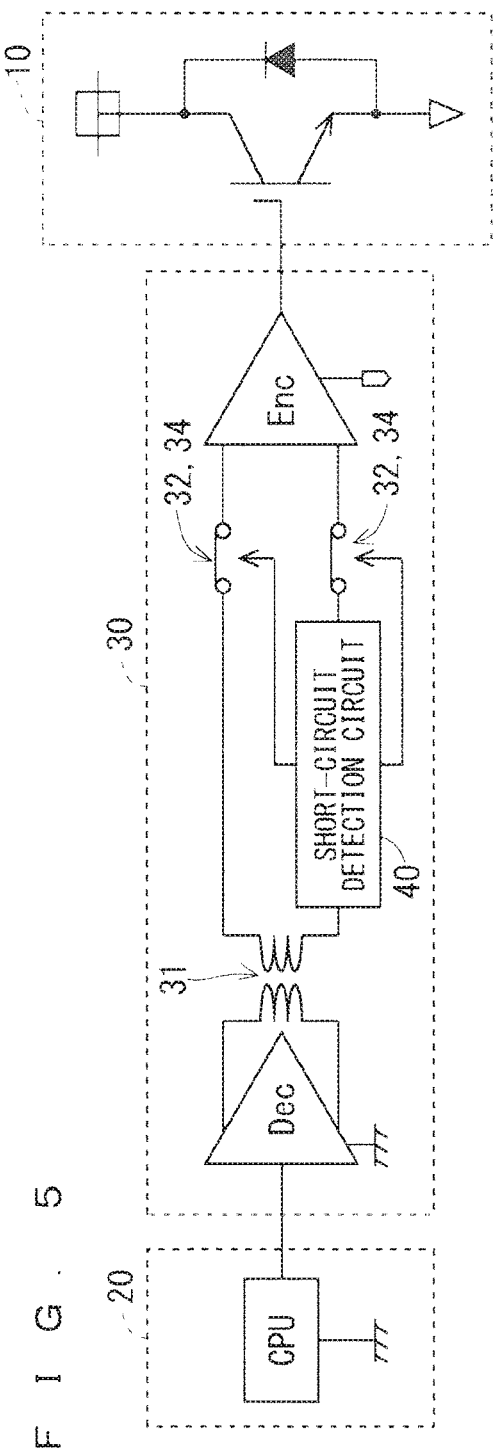
FIG. 5 is a diagram of a configuration of a semiconductor integrated circuit according to a fifth preferred embodiment.

FIG. 5 is a diagram of a configuration of the semiconductor integrated circuit according to the fifth preferred embodiment.

An insulation circuit 30 includes relay switches 34 as breaking elements 32 instead of the electric fuse elements 33 described in the fourth preferred embodiment. The relay switches 34 each switch between continuity and break (on and off states) of electrical conduction. It is noted that the relay switch 34 is herein a relay switch for high voltage.

In a normal state, the relay switch 34 is in on and is thus in electrical conduction. The insulation circuit 30 magnetically couples the control signal in an insulating element 31 to transmit the control signal from a second circuit 20 to a first circuit 10. When the insulating element 31 is a capacitive coupling element, the insulation circuit 30 capacitively couples the control signal to transmit the control signal from the second circuit 20 to the first circuit 10.

In an electrical breakdown, a short-circuit current flows from the first circuit 10, having a higher potential, to the second circuit 20, having a lower potential. The short-circuit detection circuit 40 detects this short-circuit current. The relay switch 34 switches to an off-state in accordance with the detection, thereby breaking the electrical conduction between the first circuit 10 and the second circuit 20.

As described above, if the insulating element 31 has an electrical breakdown, the breaking elements 32 would maintain insulation, thereby preventing further damage to the second circuit 20 due to the short-circuit current.

Sixth Preferred Embodiment

Figure 6:
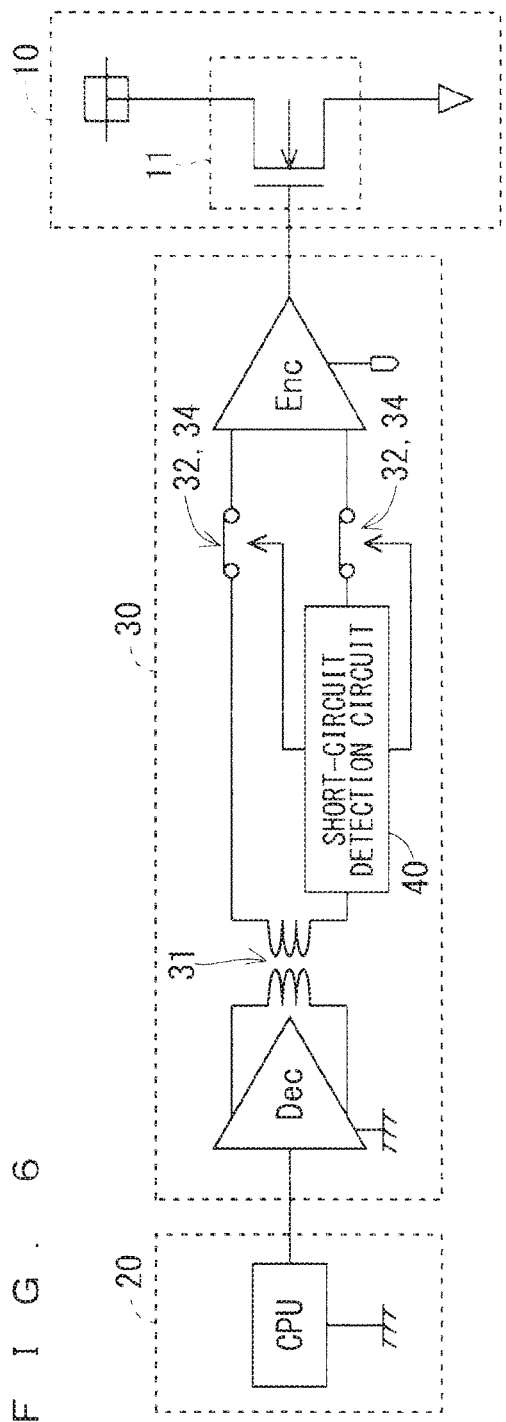
FIG. 6 is a diagram of a configuration of a semiconductor integrated circuit according to a sixth preferred embodiment.

FIG. 6 is a diagram of a configuration of a semiconductor integrated circuit according to a sixth preferred embodiment. The semiconductor integrated circuit in the sixth preferred embodiment includes a switching element 11 in the first circuit 10 of the semiconductor integrated circuit described in the fifth preferred embodiment. The switching element 11 is a semiconductor device formed of a transistor containing SiC and called a power semiconductor device to which a high voltage is applied. Herein, the switching element 11 is a SiC MOSFET.

A second circuit 20 outputs the control signal to the switching element 11 to control the driving of the switching element, and thus controls the driving of the first circuit 10.

A power semiconductor device, such as a SiC MOSFET provides high performance in an application requiring high-speed operation or an application requiring high strength. In the sixth preferred embodiment, the semiconductor integrated circuit includes the insulation circuit 30, such as digital isolators having high-insulation performance and high-speed performance. This improves a system level when the semiconductor integrated circuit controls the driving of the power semiconductor device.

In the sixth preferred embodiment, the insulation circuit 30 includes breaking elements 32 each serving as the relay switch 34 described in the fifth preferred embodiment. An insulation circuit including breaking elements 32 each serving as the electric fuse element 33 described in the fourth preferred embodiment achieves an effect similar to that described above.

It is noted that in the present invention, the individual embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit comprising:
   a first circuit controlled by a control signal of low voltage and driven at a higher voltage than the control signal of low voltage;
   a second circuit configured to output the control signal of low voltage to the first circuit to control driving of the first circuit; and
   an insulation circuit including a plurality of insulating elements connected to each other in series, the insulation circuit connecting between the first circuit and the second circuit in series, wherein
   each of the plurality of insulating elements includes an insulating member and a pair of conductive members on both sides of the insulating member and individually insulates the first circuit from the second circuit, and
   the insulation circuit is configured such that the second circuit is capacitively coupled or magnetically coupled to the first circuit via the plurality of insulating elements, and the plurality of insulating elements transmit the control signal from the second circuit to the first circuit, and is configured to insulate the first circuit from the second circuit in each insulating element to prevent the higher voltage from being applied from the first circuit to the second circuit.

2. The semiconductor integrated circuit according to claim 1, wherein
   the insulation circuit includes a short-circuit detection circuit connected between two insulating elements of the plurality of insulating elements adjacent to each other, and
   the short-circuit detection circuit is configured to detect an electrical breakdown in accordance with a potential difference between the two insulating elements adjacent to each other, and to output information about the electrical breakdown to the second circuit.

3. The semiconductor integrated circuit according to claim 1, wherein
   the first circuit includes a switching element,
   the second circuit is configured to output the control signal to the switching element to control driving of the switching element to control the driving of the first circuit, and
   the switching element is a semiconductor device formed of a transistor containing SiC.

4. A semiconductor integrated circuit comprising:
   a first circuit controlled by a control signal of low voltage and driven at a higher voltage than the control signal of low voltage;
   a second circuit configured to output the control signal of low voltage to the first circuit to control driving of the first circuit;
   an insulation circuit including at least one insulating element and at least one breaking element connected to each other in series, the at least one breaking element being switchable from a conduction state into an insulation state, the insulation circuit connecting between the first circuit and the second circuit in series; and
   a short-circuit detection circuit disposed between the first circuit and the second circuit, and configured to detect a short-circuit current, wherein
   at least one of the short-circuit detection circuit and the at least one breaking element is connected closer to the first circuit than the second circuit with respect to the at least one insulating element to receive an output from the at least one insulating element based on the control signal, and the insulation circuit is configured such that the second circuit is capacitively coupled or magnetically coupled to the first circuit via the at least one insulating element, and the at least one insulating element transmits the control signal from the second circuit to the first circuit, and is configured to switch the at least one breaking element into the insulation state in accordance with detection of the short-circuit current in the short-circuit detection circuit to prevent the higher voltage from being applied from the first circuit to the second circuit.

5. The semiconductor integrated circuit according to claim 4, wherein the short-circuit detection circuit is connected on a side near the first circuit with respect to the at least one insulating element, and the breaking element is connected on the side near the first circuit with respect to the at least one insulating element, and includes an electric fuse element configured to break electrical conduction in accordance with the detection of the short-circuit current.

6. The semiconductor integrated circuit according to claim 4, wherein the short-circuit detection circuit is connected on a side near the first circuit with respect to the at least one insulating element, and the breaking element is connected on the side near the first circuit with respect to the at least one insulating element, and includes a relay switch configured to switch between continuity and break of electrical conduction in accordance with the detection of the short-circuit current to break the electrical conduction.

7. The semiconductor integrated circuit according to claim 4, wherein the first circuit includes a switching element, the second circuit is configured to output the control signal to the switching element to control driving of the switching element to control the driving of the first circuit, and the switching element is a semiconductor device formed of a transistor containing SiC.

* * * * *